(12) United States Patent
Chiang et al.

(10) Patent No.: US 9,691,663 B2
(45) Date of Patent: Jun. 27, 2017

(54) INTEGRATED CIRCUIT STRUCTURE AND METHOD FOR MANUFACTURING THEREOF

(71) Applicant: TAIWAN SEMICONDUCTOR MANUFACTURING CO., LTD., Hsinchu (TW)

(72) Inventors: Tsung-Yu Chiang, New Taipei (TW); Kuang-Hsin Chen, Taoyuan (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 0 days.

(21) Appl. No.: 14/994,603

(22) Filed: Jan. 13, 2016

(65) Prior Publication Data

US 2016/0126140 A1  May 5, 2016

Related U.S. Application Data

(62) Division of application No. 14/174,547, filed on Feb. 6, 2014, now Pat. No. 9,269,626.

(51) Int. Cl.
*H01L 21/8234* (2006.01)
*H01L 27/088* (2006.01)

(52) U.S. Cl.
CPC ...... *H01L 21/823418* (2013.01); *H01L 21/823437* (2013.01); *H01L 27/088* (2013.01)

(58) Field of Classification Search
CPC ..... H01L 21/823807; H01L 21/823842; H01L 21/823814; H01L 29/7846; H01L 29/6659
See application file for complete search history.

(56) References Cited

U.S. PATENT DOCUMENTS

| 8,828,831 B2* | 9/2014 | Adam ............ H01L 21/823807 257/288 |
| 8,969,163 B2* | 3/2015 | Aquilino .......... H01L 21/76232 257/374 |
| 2013/0285143 A1* | 10/2013 | Oh ................. H01L 21/823821 257/347 |

FOREIGN PATENT DOCUMENTS

KR    10-2003-0052481 A     6/2003

* cited by examiner

*Primary Examiner* — Quoc Hoang
(74) *Attorney, Agent, or Firm* — McDermott Will & Emery LLP

(57) ABSTRACT

A method of manufacturing an integrated circuit structure includes forming a plurality of gate stacks on a first area and a second area of a substrate. A photo-resist layer is formed over the gate stacks on the first area. An ion-doped layer is formed in the second area. The photo-resist layer is removed. A first etching recess is formed in the first area and between two gate stacks. A second etching recess is formed in the second area and between two gate stacks. An epitaxial material is filled into the first etching recess and the second etching recess to form a first epitaxial structure and a second epitaxial structure.

20 Claims, 14 Drawing Sheets

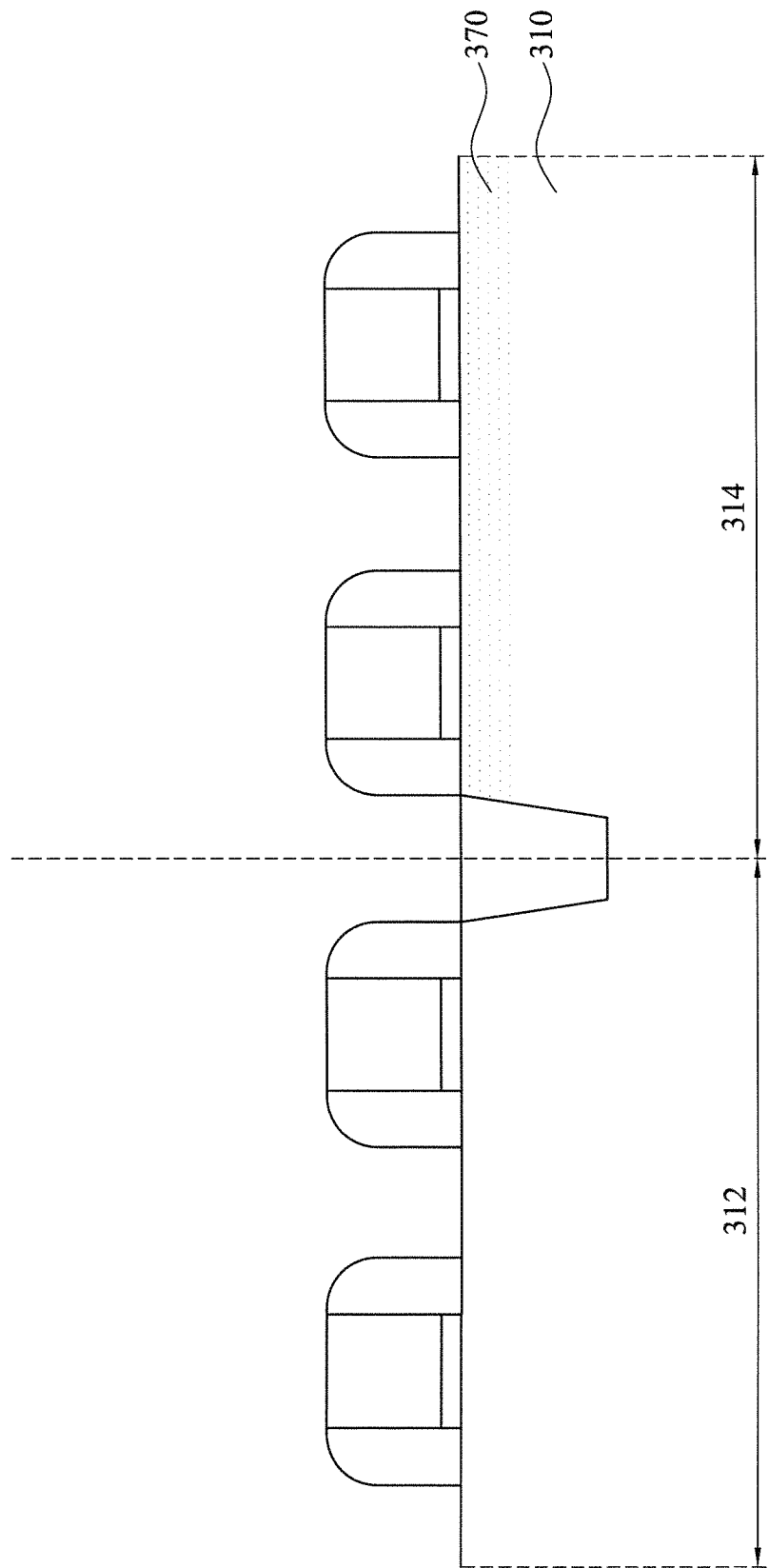

INTEGRATED CIRCUIT STRUCTURE AND METHOD FOR MANUFACTURING THEREOF

PRIORITY CLAIM AND CROSS-REFERENCE

This application is a divisional application of U.S. application Ser. No. 14/174,547, filed Feb. 6, 2014, pending, which is herein incorporated by reference.

BACKGROUND

Integrated circuit structures are small electronic components that are fabricated and integrated in a semiconductor wafer. Using a variety of fabrication operations, the integrated circuit structures are made and connected to form integrated circuits on the semiconductor wafer. The integrated circuits are capable of performing functions in operations of an electronic device.

In the electronic device, it is often desired to produce a semiconductor chip with various integrated circuit structures (e.g. a core device and an input-output (I/O) device) according to the requirements in processing speed and power. For example, the I/O device may usually need to sustain a high voltage in the operation. However, the leakage current increases with the high voltage operation. Accordingly, improvements in integrated circuit structures and methods for fabricating the integrated circuit structures continue to be sought.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A-3E are schematic cross-sectional views at various stages of fabricating an integrated circuit structure, in accordance with some embodiments;

DETAILED DESCRIPTION

Figure 1:
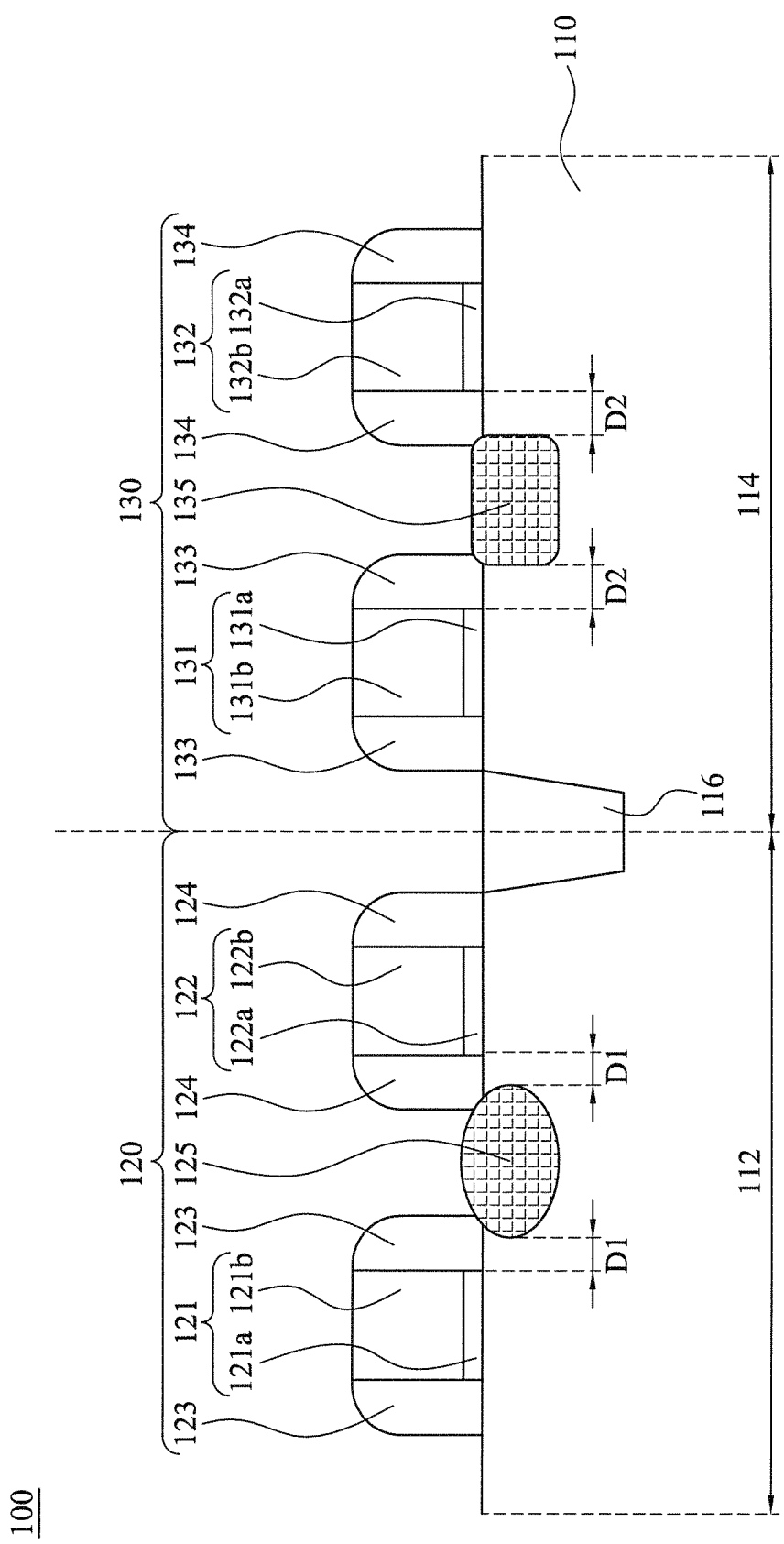
FIGS. 1-2 are schematic cross-sectional views of integrated circuit structures, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A conventional integrated circuit structure includes a core device and an input-output (I/O) device. There are a first distance between an epitaxial structure and a gate stack in the core device, and a second distance between an epitaxial structure and a gate stack in the I/O device. The first distance is the same as the second distance. However, the I/O device may increase the leakage current, while the I/O device is operated under high voltage operation. In this regard, an integrated circuit structure and a method for fabricating thereof are provided according to various embodiments of the present disclosure.

FIG. 1 is a schematic cross-sectional view of an integrated circuit structure 100 according to various embodiments of the present disclosure. In FIG. 1, the integrated circuit structure 100 includes a substrate 110, a low voltage device 120, and a high voltage device 130.

The substrate 110 has a first area 112 and a second area 114. In various embodiments of the present disclosure, the substrate 110 is a semiconductor substrate. In various embodiments of the present disclosure, the substrate 110 further includes a shallow trench isolation (STI) 116 which is disposed in the substrate 110 and between the first area 112 and the second area 114.

The low voltage device 120 is disposed on the first area 112 of the substrate 110, and includes a first gate stack 121, a second gate stack 122 and a first epitaxial structure 125. In various embodiments of the present disclosure, the low voltage device 120 includes a core metal-oxide semiconductor (MOS) device.

The first gate stack 121 and the second gate stack 122 are disposed on the first area 112 of the substrate 110. In various embodiments of the present disclosure, the first gate stack 121 includes a gate dielectric layer 121a disposed on the substrate 110 and a gate material 121b disposed on the gate dielectric layer 121a; and the second gate stack 122 includes a gate dielectric layer 122a disposed on the substrate 110 and a gate material 122b disposed on the gate dielectric layer 122a. In various embodiments of the present disclosure, spacer pairs 123 and 124 are individually on the sidewalls of the first gate stack 121 and the second gate stack 122.

In various embodiments of the present disclosure, the gate dielectric layers 121a and 122a are made from a high-k dielectric material including hafnium oxide ($HfO_2$), tantalum oxide ($Ta_2O_5$), zirconium oxide ($ZrO_2$) or aluminum oxide ($Al_2O_3$). In various embodiments of the present disclosure, the gate materials 121b and 122b are made of metal or polysilicon. In various embodiments of the present disclosure, the spacer pairs 123 and 124 are made of silicon nitride or silicon oxynitride.

The first epitaxial structure 125 is disposed on the first area 112 of the substrate 110 and between the first gate stack 121 and the second gate stack 122. The low voltage device 120 has a first beeline distance D1 from the first epitaxial structure 125 to the first gate stack 121 or the second gate stack 122. In various embodiments of the present disclosure, the first epitaxial structure 125 is made of a P-type semiconductor material or an N-type semiconductor material.

The high voltage device 130 is disposed on the second area 114 of the substrate 110, and includes a third gate stack 131, a fourth gate stack 132 and a second epitaxial structure 135. In various embodiments of the present disclosure, the high voltage device 130 includes an input-output (I/O) MOS device.

The third gate stack 131 and the fourth gate stack 132 are disposed on the second area 114 of the substrate 110. In various embodiments of the present disclosure, the third gate stack 131 includes a gate dielectric layer 131a disposed on the substrate 110 and a gate material 131b disposed on the gate dielectric layer 131a; and the fourth gate stack 132 includes a gate dielectric layer 132a disposed on the substrate 110 and a gate material 132b disposed on the gate dielectric layer 132a. In various embodiments of the present disclosure, spacer pairs 133 and 134 are individually on the sidewalls of the third gate stack 131 and the fourth gate stack 132.

In various embodiments of the present disclosure, the gate dielectric layers 131a and 132a are made from a high-k dielectric material including hafnium oxide ($HfO_2$), tantalum oxide ($Ta_2O_5$), zirconium oxide ($ZrO_2$) or aluminum oxide ($Al_2O_3$). In various embodiments of the present disclosure, the gate materials 131b and 132b are made of metal or polysilicon. In various embodiments of the present disclosure, the spacer pairs 133 and 134 are made of silicon nitride or silicon oxynitride.

The second epitaxial structure 135 is disposed on the second area 114 of the substrate 110 and between the third gate stack 131 and the fourth gate stack 132. The high voltage structure 130 has a second beeline distance D2 from the second epitaxial structure 135 to the third gate stack 131 or the fourth gate stack 132. In various embodiments of the present disclosure, the second epitaxial structure 135 is made of a P-type semiconductor material or an N-type semiconductor material.

The second beeline distance D2 of the high voltage device 130 is greater than the first beeline distance D1 of the low voltage device 120. In various embodiments of the present disclosure, the first beeline distance D1 and the second beeline distance D2 have a difference. The difference is in a range of about 3 nm to about 10 nm. In various embodiments of the present disclosure, the ratio of D2 to D1 is in a range of 1-4.

When the second beeline distance between the second epitaxial structure to the third or fourth gate stack in the high voltage device is significantly greater than the first beeline distance between the first epitaxial structure to the first or second gate stack in the low voltage device, the leakage current in the high voltage device may be decreased under high voltage operation.

Figure 2:
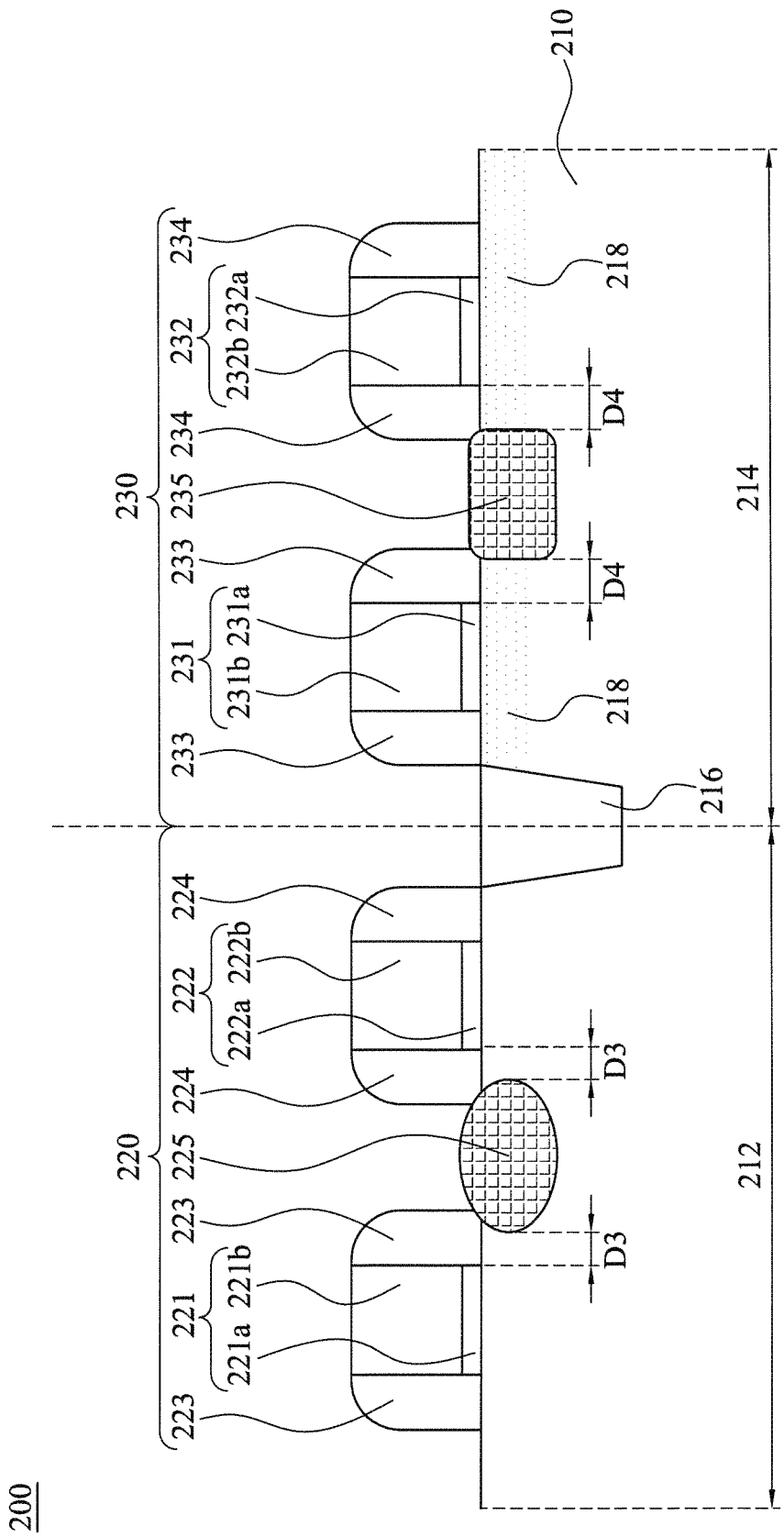

FIG. 2 is a schematic cross-sectional view of an integrated circuit structure 200 according to various embodiments of the present disclosure. In FIG. 2, the integrated circuit structure 200 includes a substrate 210, a low voltage device 220, and a high voltage device 230.

The substrate 210 has a first area 212 and a second area 214. In various embodiments of the present disclosure, the substrate 210 is a semiconductor substrate. In various embodiments of the present disclosure, the substrate 210 further includes a shallow trench isolation (STI) 216 which is disposed in the substrate 210 and between the first area 212 and the second area 214.

Different from the integrated circuit structure 100 in FIG. 1, the substrate 210 of the integrated circuit structure 200 further includes an ion-doped layer 218 in the second area 214. The ion-doped layer 218 is formed by an ion implantation process. In various embodiments of the present disclosure, the ion-doped layer 218 includes carbon (C), germanium (Ge), boron (B), boron fluoride (BF)), phosphor (P), arsenic (As), antimony (Sb), and the combination thereof.

The low voltage device 220 is disposed on the first area 212 of the substrate 210, and includes a first gate stack 221, a second gate stack 222 and a first epitaxial structure 225. In various embodiments of the present disclosure, the low voltage device 220 includes a core metal-oxide semiconductor (MOS) device.

The first gate stack 221 and the second gate stack 222 are disposed on the first area 212 of the substrate 210. In various embodiments of the present disclosure, the first gate stack 221 includes a gate dielectric layer 221a disposed on the substrate 210 and a gate material 221b disposed on the gate dielectric layer 221a; and the second gate stack 222 includes a gate dielectric layer 222a disposed on the substrate 210 and a gate material 222b disposed on the gate dielectric layer 222a. In various embodiments of the present disclosure, spacer pairs 223 and 224 are individually on the sidewalls of the first gate stack 221 and the second gate stack 222.

In various embodiments of the present disclosure, the gate dielectric layers 221a and 222a are made from a high-k dielectric material including hafnium oxide ($HfO_2$), tantalum oxide ($Ta_2O_5$), zirconium oxide ($ZrO_2$) or aluminum oxide ($Al_2O_3$). In various embodiments of the present disclosure, the gate materials 221b and 222b are made of metal or polysilicon. In various embodiments of the present disclosure, the spacer pairs 223 and 224 are made of silicon nitride or silicon oxynitride.

The first epitaxial structure 225 is disposed on the first area 212 of the substrate 210 and between the first gate stack 221 and the second gate stack 222. The low voltage device 220 has a first beeline distance D3 from the first epitaxial structure 225 to the first gate stack 221 or the second gate stack 222. In various embodiments of the present disclosure, the first epitaxial structure 225 is made of a P-type semiconductor material or an N-type semiconductor material.

The high voltage device 230 is disposed on the second area 214 of the substrate 210, and includes a third gate stack 231, a fourth gate stack 232 and a second epitaxial structure 235. In various embodiments of the present disclosure, the high voltage device 230 includes an input-output (I/O) MOS device.

The third gate stack 231 and the fourth gate stack 232 are disposed on the second area 214 of the substrate 210. In various embodiments of the present disclosure, the third gate stack 231 includes a gate dielectric layer 231a disposed on the substrate 210 and a gate material 231b disposed on the gate dielectric layer 231a; and the fourth gate stack 232 includes a gate dielectric layer 232a disposed on the substrate 210 and a gate material 232b disposed on the gate dielectric layer 232a. In various embodiments of the present disclosure, spacer pairs 233 and 234 are individually on the sidewalls of the third gate stack 231 and the fourth gate stack 232.

In various embodiments of the present disclosure, the gate dielectric layers 231a and 232a are made from a high-k dielectric material including hafnium oxide ($HfO_2$), tantalum oxide ($Ta_2O_5$), zirconium oxide ($ZrO_2$) or aluminum oxide ($Al_2O_3$). In various embodiments of the present disclosure, the gate materials 231b and 232b are made of metal or polysilicon. In various embodiments of the present disclosure, the spacer pairs 233 and 234 are made of silicon nitride or silicon oxynitride.

The second epitaxial structure 235 is disposed on the second area 214 of the substrate 210 and between the third gate stack 231 and the fourth gate stack 232. The high voltage device 230 has a second beeline distance D4 from the second epitaxial structure 235 to the third gate stack 231 or the fourth gate stack 232. In various embodiments of the present disclosure, the second epitaxial structure 235 is made of a P-type semiconductor material or an N-type semiconductor material.

The second beeline distance D4 of the high voltage device 230 is greater than the first beeline distance D3 of the low voltage device 220. In various embodiments of the present disclosure, the first beeline distance D3 and the second beeline distance D4 have a difference. The difference is in a range of about 3 nm to about 10 nm. In various embodiments of the present disclosure, the ratio of D4 to D3 is in a range of 1-4.

When the second beeline distance between the second epitaxial structure to the third or fourth gate stack in the high voltage device is significantly greater than the first beeline distance between the first epitaxial structure to the first or second gate stack in the low voltage device, the leakage current in the high voltage device may be decreased under high voltage operation.

FIGS. 3A-3E are schematic cross-sectional views at various stages of fabricating an integrated circuit structure according to various embodiments of the present disclosure. The method is able to locally repair all types of aforementioned issues, so as to enhance the dielectric property of the gate stack in the integrated circuit structure according to various embodiments of the present disclosure.

Figure 3A:
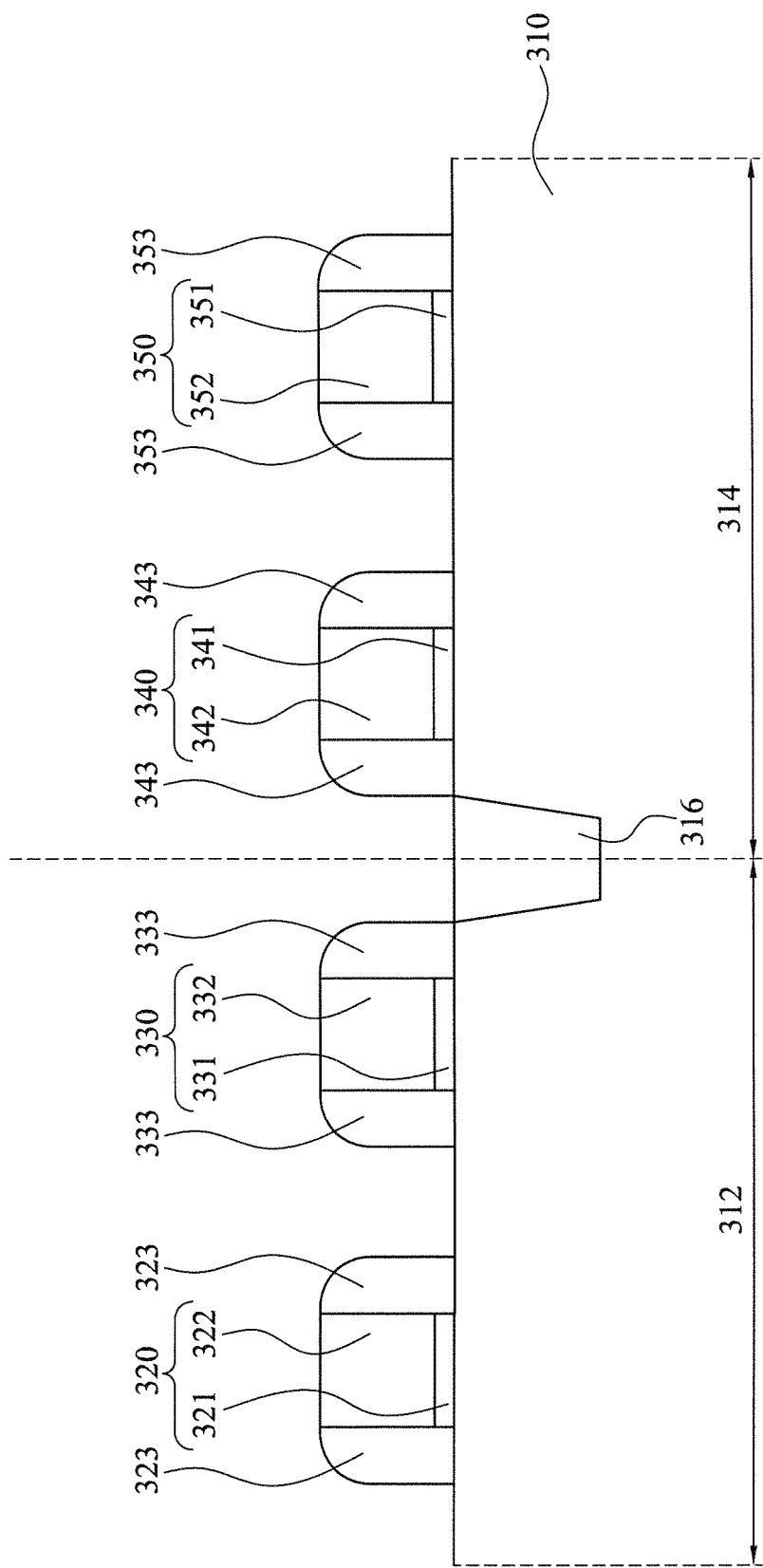

In FIG. 3A, gate stacks 320 and 330 are formed on a first area 312 of a substrate 310, and gate stacks 340 and 350 are formed on a second area 314 of the substrate 310. In various embodiments of the present disclosure, several gate stacks are individually formed on the first area 312 and the second area 314 of the substrate 310. In various embodiments of the present disclosure, a shallow trench isolation 316 is further formed in the substrate 310 and between the first area 312 and the second area 314.

The gate stack 320, 330, 340 and 350 are individually formed of gate dielectric layers 321, 331, 341 and 351 and gate materials 322, 332, 342 and 352. The gate dielectric layers 321, 331, 341 and 351 are individually formed on the substrate 310, and the gate materials 322, 332, 342 and 352 are individually formed on the gate dielectric layers 321, 331, 341 and 351.

In various embodiments of the present disclosure, the gate dielectric layers 321, 331, 341 and 351 are formed of a high-k dielectric material including hafnium oxide ($HfO_2$), tantalum oxide ($Ta_2O_5$), zirconium oxide ($ZrO_2$) or aluminum oxide ($Al_2O_3$). In various embodiments of the present disclosure, the gate dielectric layers 321, 331, 341 and 351 are by performing a deposition process such as physical vapor deposition (PVD), chemical vapor deposition (CVD), atomic layer deposition (ALD) or plasma-enhanced chemical vapor deposition (PECVD), and a patterning process such as an etching process.

In various embodiments of the present disclosure, the gate materials 322, 332, 342 and 352 are formed of a metal or a polysilicon. In various embodiments of the present disclosure, the gate materials 322, 332, 342 and 352 are by performing a deposition process such as physical vapor deposition (PVD), chemical vapor deposition (CVD), atomic layer deposition (ALD) or plasma-enhanced chemical vapor deposition (PECVD), and a patterning process such as an etching process.

In various embodiments of the present disclosure, several spacer pairs 323, 333, 343 and 353 are individually formed on the sidewalls of the gate stacks 320, 330, 340 and 350. In various embodiments of the present disclosure, the spacer pairs 323, 333, 343 and 353 may be formed of silicon nitride by a deposition process such as physical vapor deposition (PVD), chemical vapor deposition (CVD), atomic layer deposition (ALD) or plasma-enhanced chemical vapor deposition (PECVD).

Figure 3B:
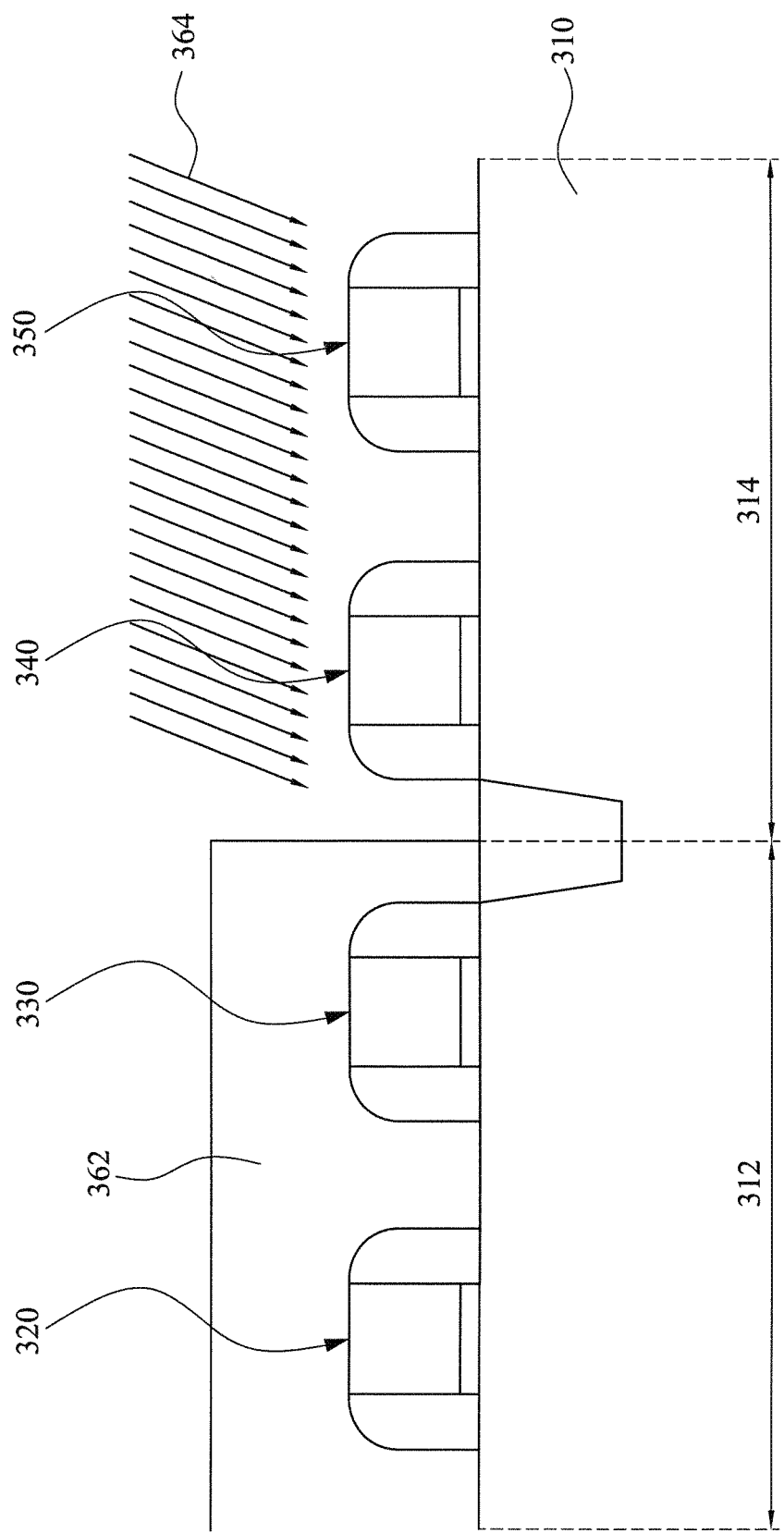

Referring to FIG. 3B, a photo-resist layer 362 is formed over the gate stacks 320 and 330 on the first area 312 of the substrate 310, and performing an ion implantation process 364 on the second area 314 of the substrate 310. Because of formation of the photo-resist layer over the gate stacks 320 and 330 on the first area 312 of the substrate 310, the ion implantation process 364 may be only performed on the second area 314 of the substrate 310. In various embodiments of the present disclosure, the ion implantation process 364 may implant various ions into the second area 314 of the substrate 310, and the ions include carbon (C), germanium (Ge), boron (B), boron fluoride ($BF_2$), phosphor (P), arsenic (As), antimony (Sb), and the combination thereof.

Still referring to FIG. 3C, an ion-doped layer 370 is formed in the second area 314 of the substrate 310 after performing the ion implantation process 364 in FIG. 3B. Then, the photo-resist layer 362 on the first area 312 of the substrate 310 is removed. In various embodiments of the present disclosure, the ion-doped layer 370 is formed being an N-type ion-doped layer or a P-type ion-doped layer.

Figure 3D:
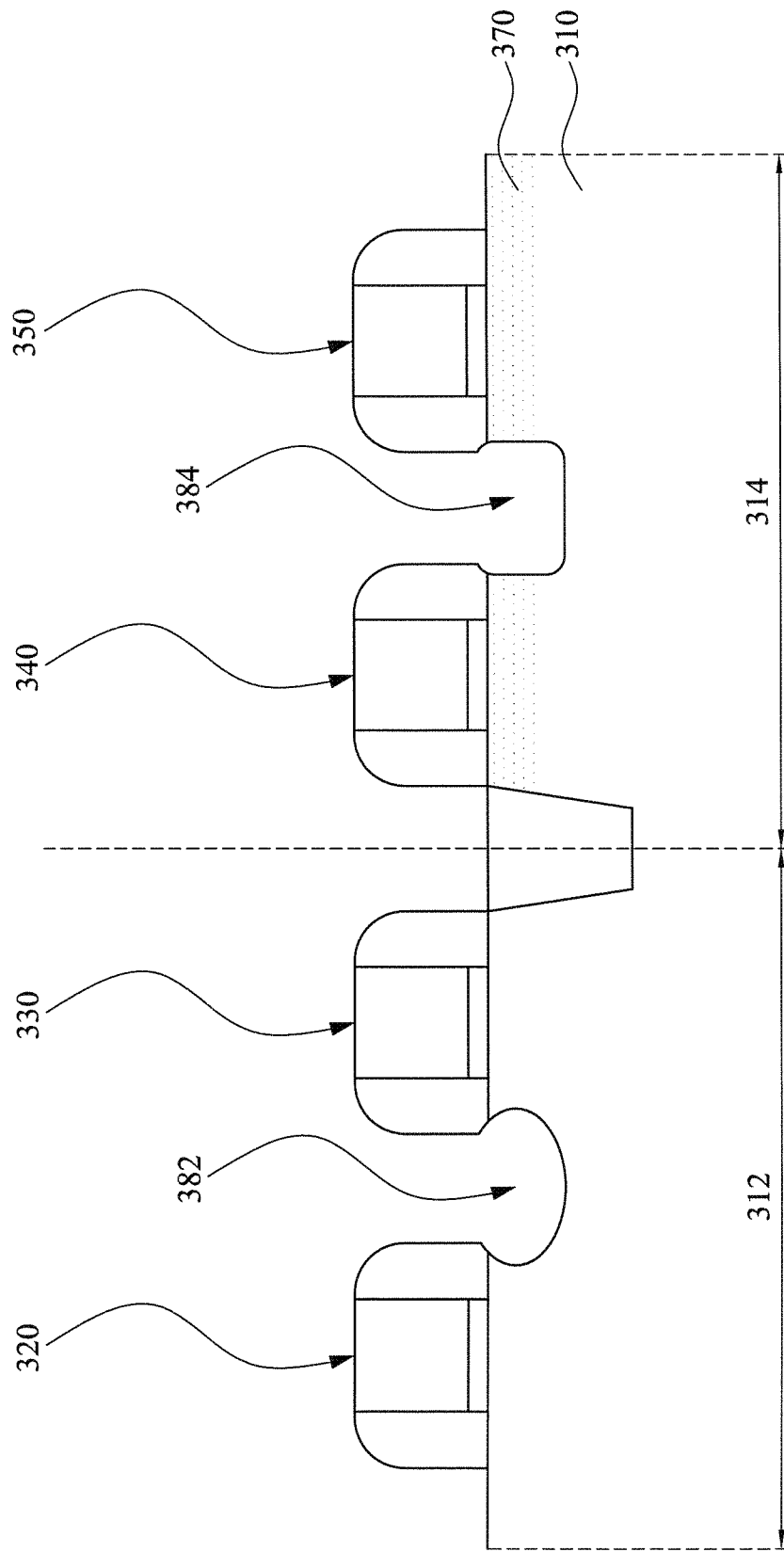

In FIG. 3D, a first etching recess 382 is formed in the first area 312 of the substrate 310 and between the gate stacks 320 and 330 on the first area 312 of the substrate 310; and a second etching recess 384 is formed in the second area 314 of the substrate 310 and between the gate stacks 340 and 350 on the second area 314 of the substrate 310. In various embodiments of the present disclosure, the first etching recess 382 and the second etching recess 384 are by performing an etching process. In various embodiments of the present disclosure, the etching process is an isotropic etching process such as a wet-etching process.

Because the ion implantation process 364 is performed on the second area 314 of the substrate 310, the etching rate of the ion-doped layer 370 may be significantly decreased, so that the isotropic etching process performed on the ion-doped layer 370 may form an anisotropic etching recess on the second area 314 of the substrate 310. On the contrary, the first area 312 of the substrate 310 may form an isotropic etching recess by the isotropic etching process. In various embodiments of the present disclosure, the first etching recess 382 is formed being an isotropic etching recess; and the second etching recess 384 is formed being an anisotropic etching recess.

Figure 3E:
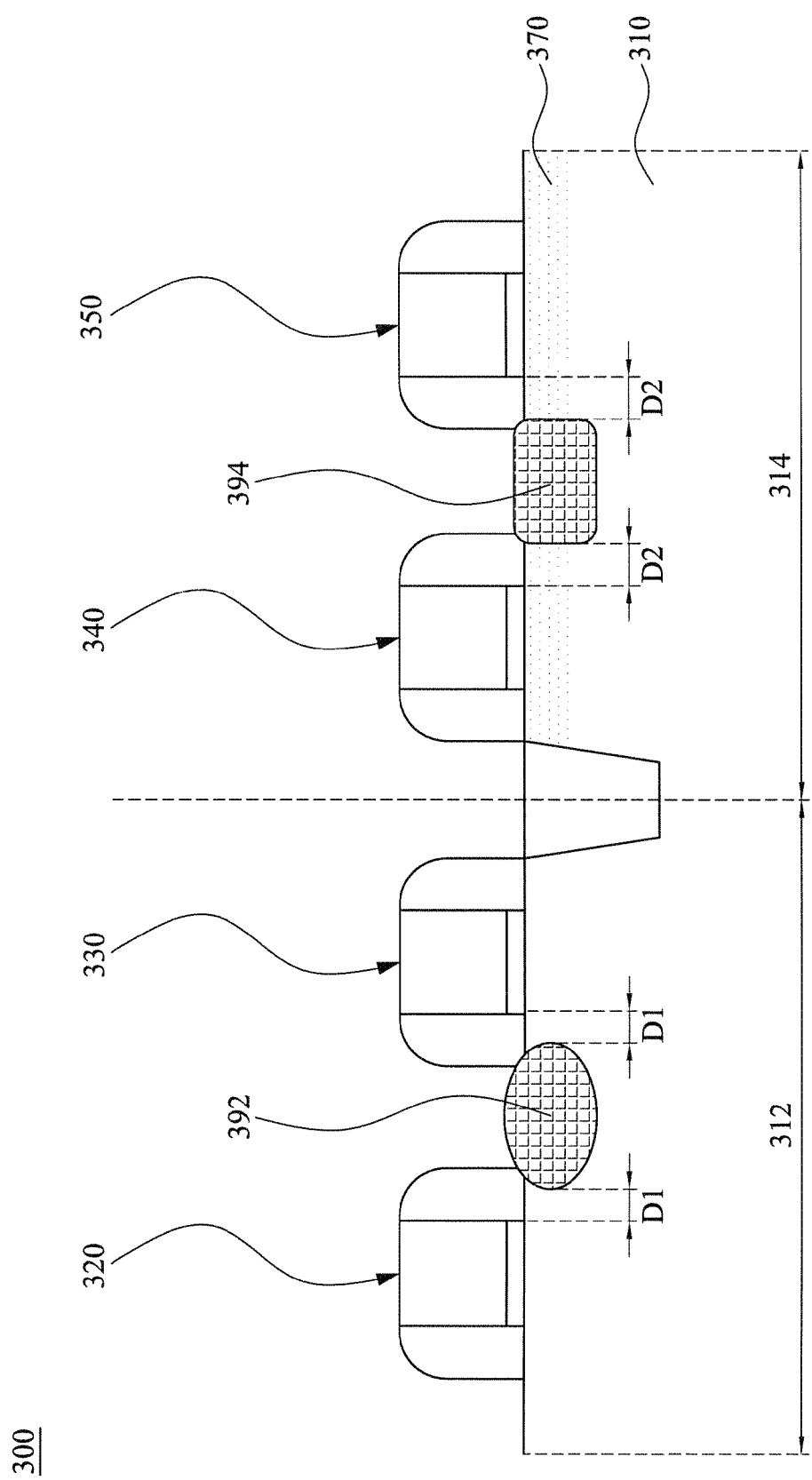

Referring to FIG. 3E, an epitaxial material is filled into the first etching recess 382 and the second etching recess 384 to individually form a first epitaxial structure 392 and a second epitaxial structure 394. In various embodiments of the present disclosure, the first epitaxial structure 392 and the second epitaxial structure 394 are by performing an epitaxial process to grow the epitaxial material in the first etching recess 382 and the second etching recess 384. In various embodiments of the present disclosure, the first epitaxial structure 392 and the second epitaxial structure 394 are formed being a P-type semiconductor structure or an N-type semiconductor structure.

The first epitaxial structure 392 in the first area 312 of the substrate 310 has a first beeline distance D1 to a sidewall of the first gate stack 320 or the second gate stack 330; and the second epitaxial structure 394 in the second area 314 of the substrate 310 has a second beeline distance D2 to a sidewall of the third gate stack 340 or the fourth gate stack 350. The second beeline distance D2 is greater than the first beeline distance D1. In various embodiments of the present disclosure, the first beeline distance D1 and the second beeline distance D2 form a difference being in a range of about 3 nm to about 10 nm. In various embodiments of the present disclosure, the ratio of D2 to D1 is in a range of 1-4.

Figure 4:
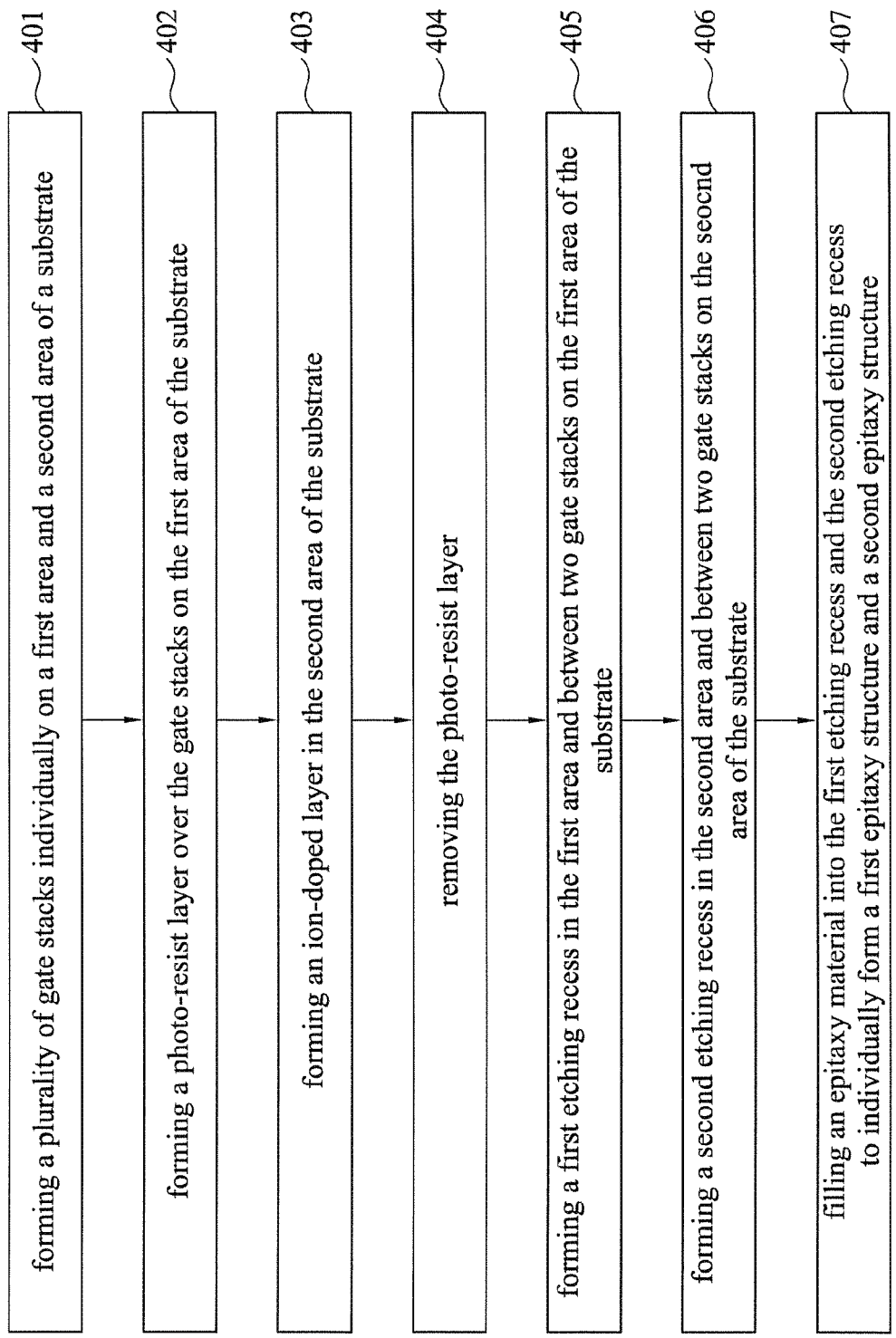
FIG. 4 is a flow chart illustrating a method of manufacturing an integrated circuit structure, in accordance with some embodiments.

FIG. 4 is a flow chart illustrating a method of manufacturing an integrated circuit structure according to various embodiments of the present disclosure. The operations 401 to 407 are disclosed in association with the cross-sectional views of the integrated circuit structure 300 from FIGS. 3A to 3E at various fabrication stages.

In the operation 401, the gate stacks 320, 330, 340 and 350 are individually formed on the first area 312 and the second area 314 of the substrate 310. Referring to FIG. 3A, a shallow trench isolation 316 are further formed in the substrate 310 and between the first area 312 and the second area 314. In various embodiments of the present disclosure, each of the gate stacks is formed of the gate dielectric layer and the gate material. In various embodiments of the present disclosure, several spacer pairs are individually formed on the sidewalls of the gate stacks.

In the operation 402, the photo-resist layer 362 is formed over the gate stacks 320 and 330 on the first area 312 of the substrate 310. Referring to FIG. 3B, the ion implantation process 364 is performed on the second area 314 of the substrate 310. In various embodiments of the present disclosure, the ion implantation process 364 may implant various ions into the second area 314 of the substrate 310.

In the operation 403, the ion-doped layer 370 is formed in the second area 314 of the substrate 310 after performing the ion implantation process 364. In various embodiments of the present disclosure, the ion-doped layer 370 may be formed including carbon (C), germanium (Ge), boron (B), boron fluoride ($BF_2$), phosphor (P), arsenic (As), antimony (Sb), and the combination thereof.

In the operation 404, the photo-resist layer 362 on the first area 312 of the substrate 310 is removed. Referring to the operation 405, the first etching recess 382 is formed in the first area 312 of the substrate 310 and between the gate stacks 320 and 330 on the first area 312 of the substrate 310. Still referring to the operation 406, the second etching recess 384 is formed in the second area 314 of the substrate 310 and between the gate stacks 340 and 350 on the second area 314 of the substrate 310.

In FIG. 3D, the first etching recess 382 is formed being an isotropic etching recess; and the second etching recess 384 is formed being an anisotropic etching recess. Because the ion implantation process 364 is performed on the second area 314 of the substrate 310, the etching rate of the ion-doped layer 370 may be significantly decreased, so that the isotropic etching process performed on the ion-doped layer 370 may form an anisotropic etching recess on the second area 314 of the substrate 310. On the contrary, the first area 312 of the substrate 310 may form an isotropic etching recess by the isotropic etching process.

In the operation 407, the epitaxial material is filled into the first etching recess 382 and the second etching recess 384 to individually form a first epitaxial structure 392 and a second epitaxial structure 394. In various embodiments of the present disclosure, the first epitaxial structure 392 and the second epitaxial structure 394 are by performing an epitaxial process to grow the epitaxial material in the first etching recess 382 and the second etching recess 384. In FIG. 3E, the first epitaxial structure 392 in the first area 312 of the substrate 310 has a first beeline distance D1 to a sidewall of the first gate stack 320 or the second gate stack 330; and the second epitaxial structure 394 in the second area 314 of the substrate 310 has a second beeline distance D2 to a sidewall of the third gate stack 340 or the fourth gate stack 350. The second beeline distance D2 is greater than the first beeline distance D1.

FIGS. 5A-5E are schematic cross-sectional views at various stages of fabricating an integrated circuit structure according to various embodiments of the present disclosure. The method is able to locally repair all types of aforementioned issues, so as to enhance the dielectric property of the gate stack in the integrated circuit structure according to various embodiments of the present disclosure.

Figure 5A:
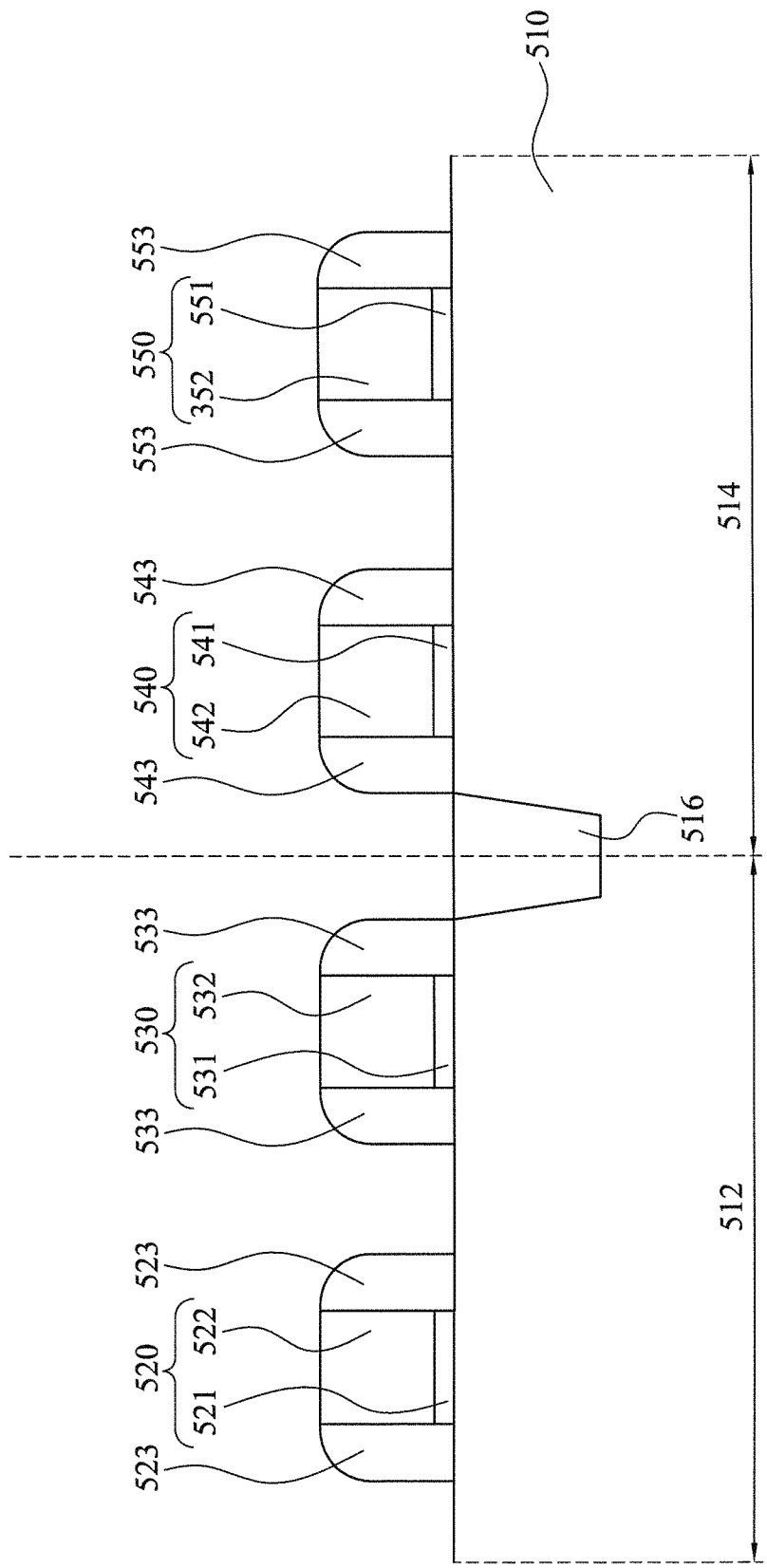
FIGS. 5A-5E are schematic cross-sectional views at various stages of fabricating an integrated circuit structure, in accordance with some embodiments.

In FIG. 5A, gate stacks 520 and 530 are formed on a first area 512 of a substrate 510, and gate stacks 540 and 550 are formed on a second area 514 of the substrate 510. In various embodiments of the present disclosure, several gate stacks are individually formed on the first area 512 and the second area 514 of the substrate 510. In various embodiments of the present disclosure, a shallow trench isolation 516 is further formed in the substrate 510 and between the first area 512 and the second area 514.

The gate stack 520, 530, 540 and 550 are individually formed of gate dielectric layers 521, 531, 541 and 551 and gate materials 522, 532, 542 and 552. The gate dielectric layers 521, 531, 541 and 551 are individually formed on the substrate 510, and the gate materials 522, 532, 542 and 552 are individually formed on the gate dielectric layers 521, 531, 541 and 551.

In various embodiments of the present disclosure, the gate dielectric layers 521, 531, 541 and 551 are formed of a high-k dielectric material including hafnium oxide ($HfO_2$), tantalum oxide ($Ta_2O_5$), zirconium oxide ($ZrO_2$) or aluminum oxide ($Al_2O_3$). In various embodiments of the present disclosure, the gate dielectric layers 521, 531, 541 and 551 are by performing a deposition process such as physical vapor deposition (PVD), chemical vapor deposition (CVD), atomic layer deposition (ALD) or plasma-enhanced chemical vapor deposition (PECVD), and a patterning process such as an etching process.

In various embodiments of the present disclosure, the gate materials 522, 532, 542 and 552 are formed of a metal or a polysilicon. In various embodiments of the present disclosure, the gate materials 522, 532, 542 and 552 are by performing a deposition process such as physical vapor deposition (PVD), chemical vapor deposition (CVD), atomic layer deposition (ALD) or plasma-enhanced chemical vapor deposition (PECVD), and a patterning process such as an etching process.

In various embodiments of the present disclosure, several spacer pairs 523, 533, 543 and 553 are individually formed on the sidewalls of the gate stacks 520, 530, 540 and 550. In various embodiments of the present disclosure, the spacer pairs 523, 533, 543 and 553 may be formed of silicon nitride by a deposition process such as physical vapor deposition (PVD), chemical vapor deposition (CVD), atomic layer deposition (ALD) or plasma-enhanced chemical vapor deposition (PECVD).

Figure 5B:
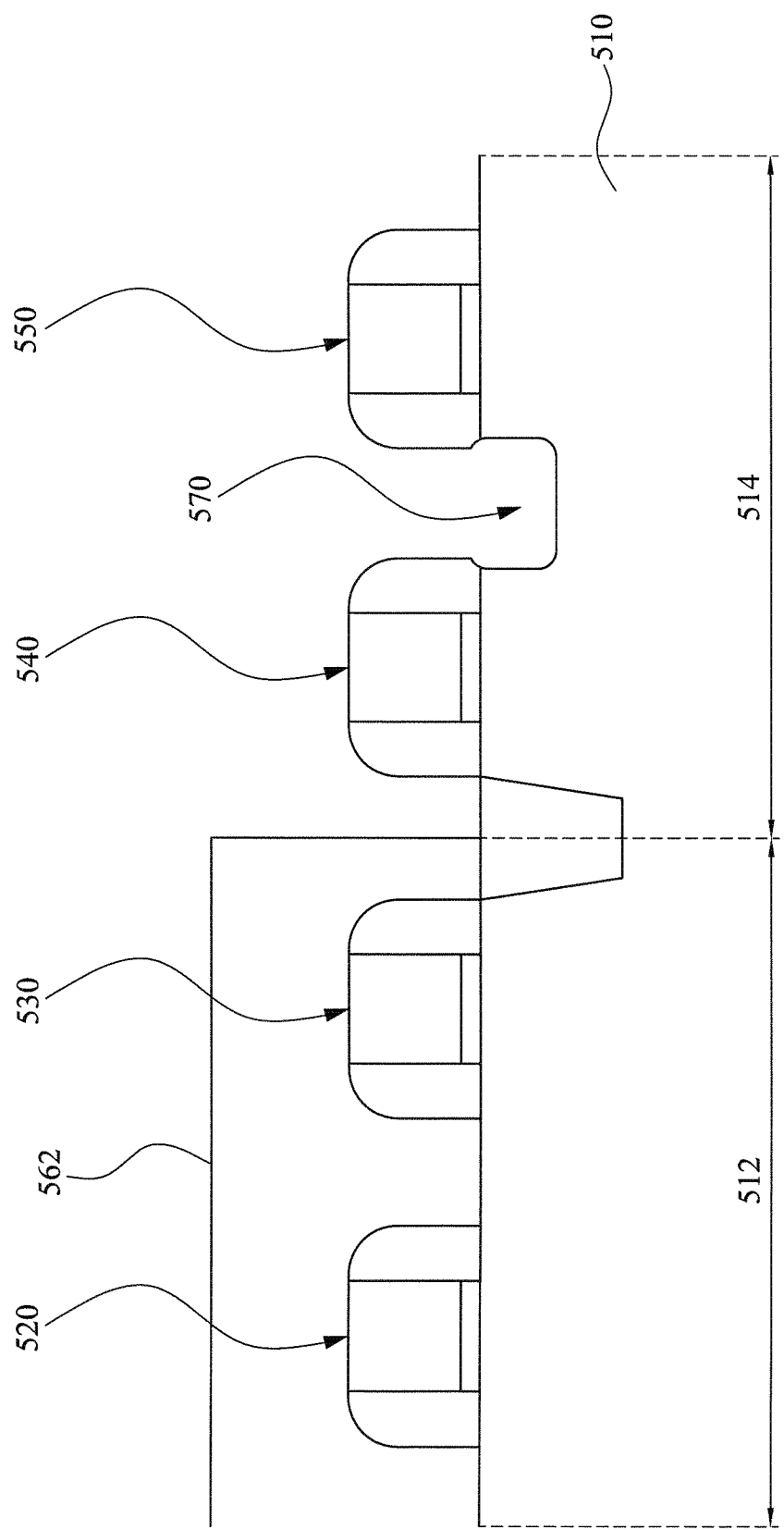

Referring to FIG. 5B, a first photo-resist layer 562 is formed over the gate stacks 520 and 530 on the first area 512 of the substrate 510, and a first etching recess 570 is formed in the second area 514 and between the gate stacks 540 and 550 on the second area 514 of the substrate 510. In various embodiments of the present disclosure, the first etching recess 570 is formed being an anisotropic etching recess. In various embodiments of the present disclosure, the first etching recess 570 is by performing an anisotropic etching process such as a dry-etching process.

Figure 5C:
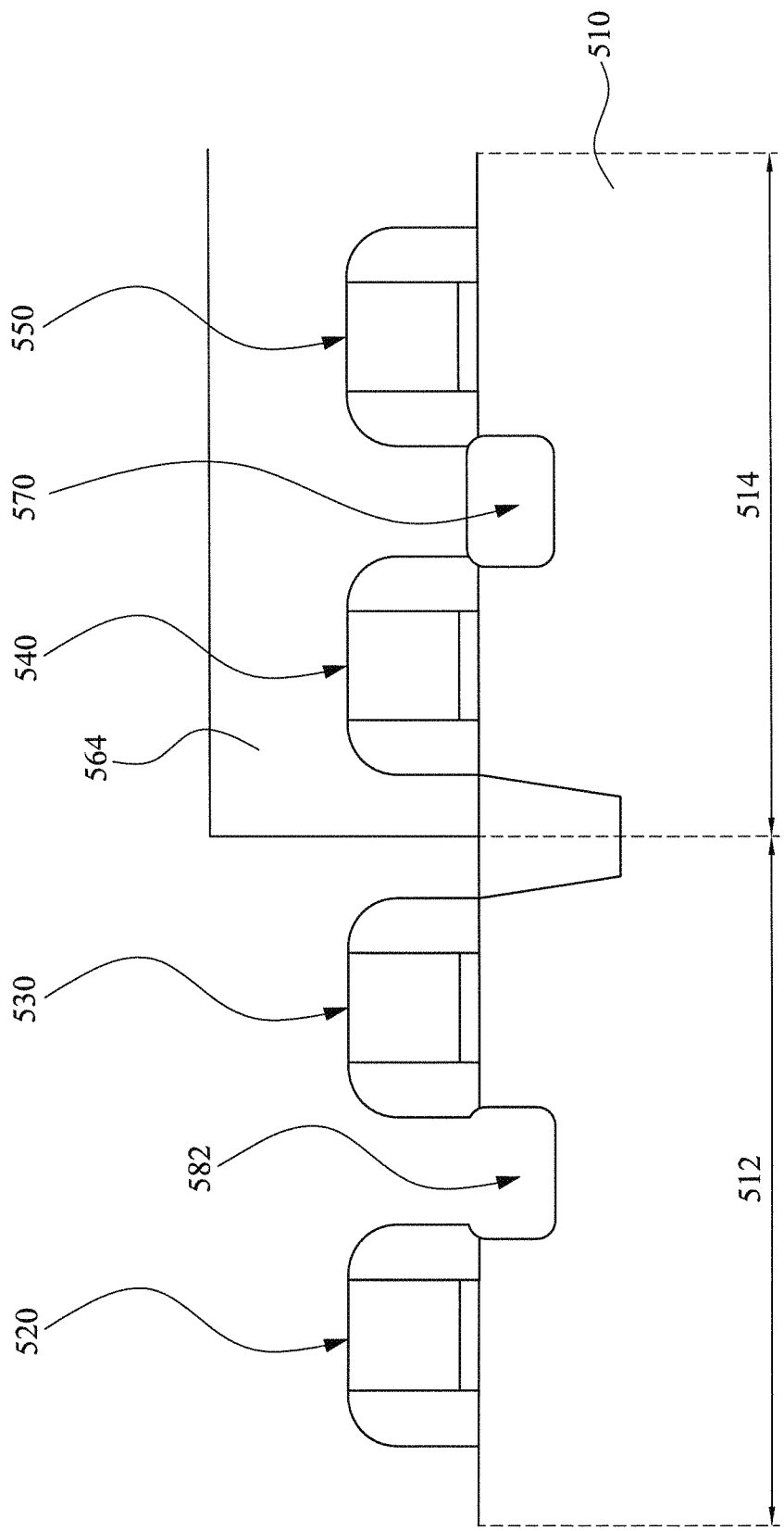

Still referring to FIG. 5C, the first photo-resist layer 562 on the first area 512 of the substrate 510 is removed. A second photo-resist layer 564 is formed over the gate stacks 540 and 550 on the second area 514 of the substrate 510, and a recess 582 is formed in the first area 512 and between the gate stacks 520 and 530 on the first area 512 of the substrate 510. In various embodiments of the present disclosure, the recess 582 is formed being another anisotropic etching recess. In various embodiments of the present disclosure, the recess 582 is by performing another anisotropic etching process such as a dry-etching process.

Figure 5D:
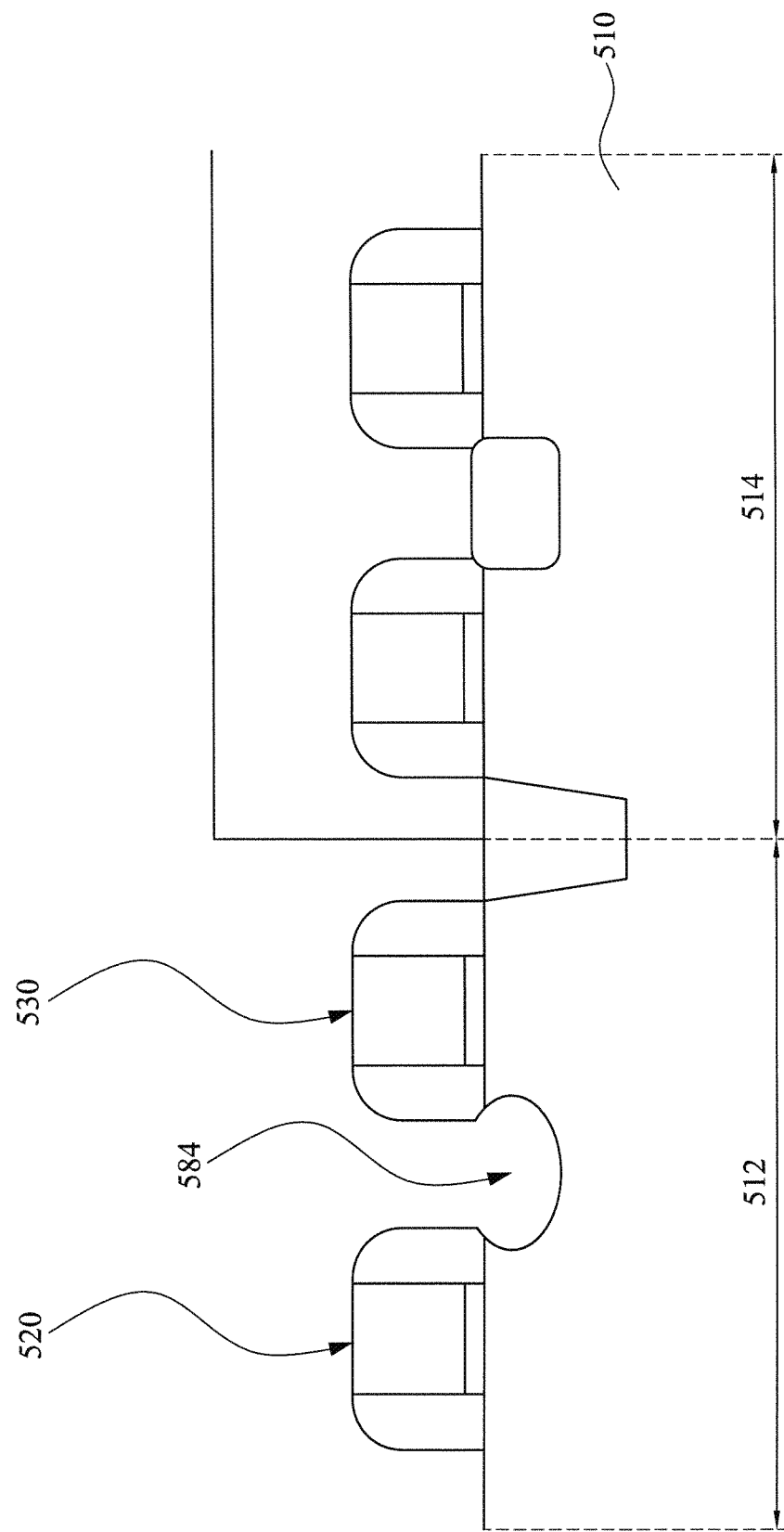

In FIG. 5D, a second etching recess 584 is formed in the first area 512 of the substrate 510 and between the gate stacks 520 and 530 on the first area 512 of the substrate 510. The second etching recess 584 is formed at the same position of the recess 582 by performing an isotropic etching process such as a wet-etching process. In various embodiments of the present disclosure, the second etching recess 584 is formed being an isotropic etching recess.

Figure 5E:
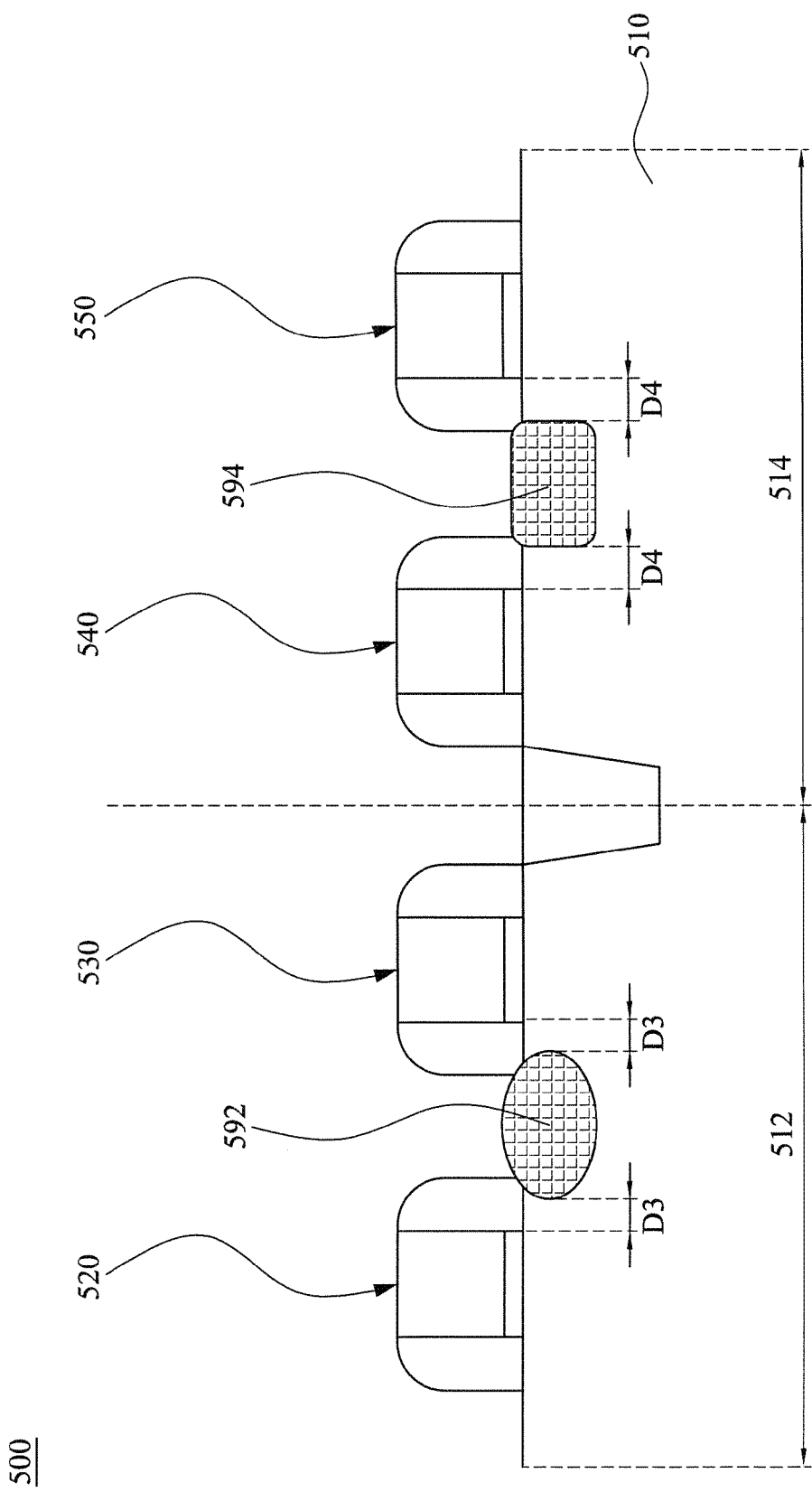

Referring to FIG. 5E, the second photo-resist layer 564 on the second area 514 of the substrate 510 is removed, and an epitaxial material is filled into the second etching recess 584 and the first etching recess 570 to individually form a first epitaxial structure 592 and a second epitaxial structure 594. In various embodiments of the present disclosure, the first epitaxial structure 592 and the second epitaxial structure 594 are by performing an epitaxial process to grow the epitaxial material in the second etching recess 584 and the first etching recess 570. In various embodiments of the present disclosure, the first epitaxial structure 592 and the second epitaxial structure 594 are formed being a P-type semiconductor structure or an N-type semiconductor structure.

The first epitaxial structure 592 in the first area 512 of the substrate 510 has a first beeline distance D3 to a sidewall of the first gate stack 520 or the second gate stack 530; and the second epitaxial structure 594 in the second area 514 of the substrate 510 has a second beeline distance D4 to a sidewall of the third gate stack 540 or the fourth gate stack 550. The second beeline distance D4 is greater than the first beeline distance D3. In various embodiments of the present disclosure, the first beeline distance D3 and the second beeline distance D4 form a difference being in a range of about 3 nm to about 10 nm. In various embodiments of the present disclosure, the ratio of D4 to D3 is in a range of 1-4.

Figure 6:
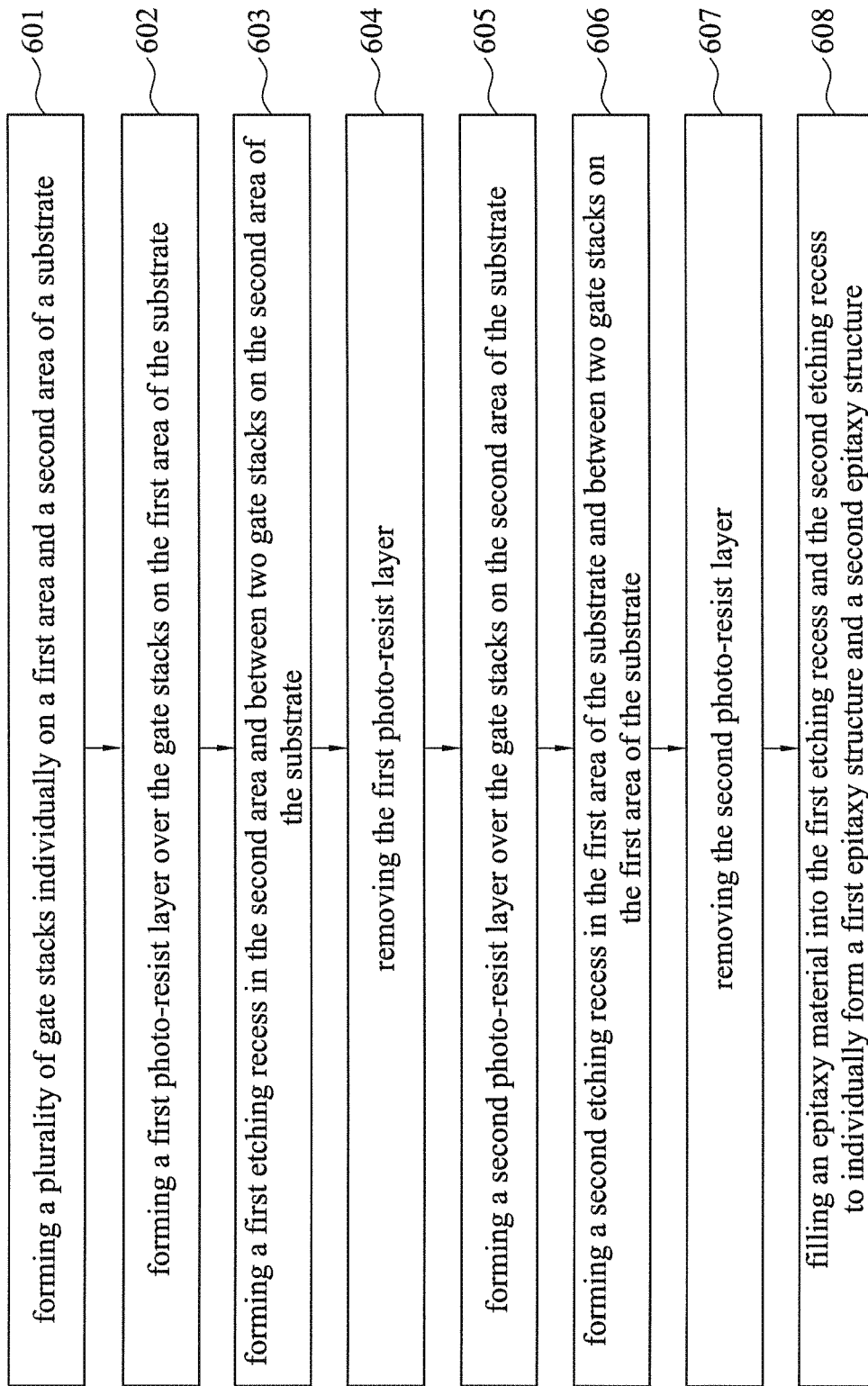
FIG. 6 is a flow chart illustrating a method of manufacturing an integrated circuit structure, in accordance with some embodiments.

FIG. 6 is a flow chart illustrating a method of manufacturing an integrated circuit structure according to various embodiments of the present disclosure. The operations 601 to 608 are disclosed in association with the cross-sectional views of the integrated circuit structure 500 from FIGS. 5A to 5E at various fabrication stages.

In the operation 601, the gate stacks 520, 530, 540 and 550 are individually formed on the first area 512 and the second area 514 of the substrate 510. Referring to FIG. 5A, a shallow trench isolation 516 are further formed in the substrate 510 and between the first area 512 and the second area 514. In various embodiments of the present disclosure, each of the gate stacks is formed of the gate dielectric layer and the gate material. In various embodiments of the present disclosure, several spacer pairs are individually formed on the sidewalls of the gate stacks.

In the operation 602, the photo-resist layer 562 is formed over the gate stacks 520 and 530 on the first area 512 of the substrate 510. Still in the operation 603, the first etching recess 570 is formed in the second area 514 and between the gate stacks 540 and 550 on the second area 514 of the substrate 510. Referring to FIG. 5B, the first etching recess 570 is formed being an anisotropic etching recess. In various embodiments of the present disclosure, the first etching recess 570 is by performing an anisotropic etching process such as a dry-etching process.

In the operation 604, the first photo-resist layer 562 on the first area 512 of the substrate 510 is removed. Still in the operation 605, the second photo-resist layer 564 is formed over the gate stacks 540 and 550 on the second area 514 of the substrate 510. Referring to FIG. 5C, the recess 582 is formed in the first area 512 and between the gate stacks 520 and 530 on the first area 512 of the substrate 510. In FIG. 5C, the recess 582 is formed being another anisotropic etching recess. In various embodiments of the present disclosure, the recess 582 is by performing another anisotropic etching process such as a dry-etching process.

Referring to FIG. 606, the second etching recess 584 is formed in the first area 512 of the substrate 510 and between the gate stacks 520 and 530 on the first area 512 of the substrate 510. In FIG. 5D, the second etching recess 584 is formed at the same position of the recess 582 by performing an isotropic etching process such as a wet-etching process. In various embodiments of the present disclosure, the second etching recess 584 is formed being an isotropic etching recess.

In the operation 607, the second photo-resist layer 564 on the second area 514 of the substrate 510 is removed. Still in the operation 608, the epitaxial material is filled into the second etching recess 584 and the first etching recess 570 to individually form a first epitaxial structure 592 and a second epitaxial structure 594. In various embodiments of the present disclosure, the first epitaxial structure 592 and the second epitaxial structure 594 are by performing an epitaxial process to grow the epitaxial material in the second etching recess 584 and the first etching recess 570.

Referring to FIG. 5E, the first epitaxial structure 592 in the first area 512 of the substrate 510 has a first beeline distance D3 to a sidewall of the first gate stack 520 or the second gate stack 530; and the second epitaxial structure 594 in the second area 514 of the substrate 510 has a second beeline distance D4 to a sidewall of the third gate stack 540 or the fourth gate stack 550. The second beeline distance D4 is greater than the first beeline distance D3.

In accordance with some embodiments, the present disclosure discloses an integrated circuit structure including a low voltage device and a high voltage device. The low voltage device has a first beeline distance from the first epitaxial structure to the adjacent gate stack(s); and the high voltage structure has a second beeline distance from the second epitaxial structure to the adjacent gate stack(s). The second beeline distance of the high voltage device is greater than the first beeline distance of the low voltage device, so that the leakage current in the high voltage device may be decreased under high voltage operation.

In accordance with some embodiments, the present disclosure disclosed a method for fabricating an integrated circuit structure. In this method, a high voltage device in the integrated circuit structure may be formed an anisotropic etching recess; and a low voltage device in the integrated circuit structure may be formed an isotropic etching recess.

In various embodiments of the present disclosure, an ion-doped layer is formed in the second area of the substrate after performing the ion implantation process. Because the ion implantation process is performed on the second area of the substrate, the etching rate of the ion-doped layer may be significantly decreased, so that the isotropic etching process performed on the ion-doped layer may form an anisotropic etching recess on the second area of the substrate. On the contrary, the first area of the substrate may form an isotropic etching recess by the isotropic etching process.

In various embodiments of the present disclosure, the anisotropic etching recess in the high voltage device and the isotropic etching recess in the low voltage device are formed sequentially. For example, the anisotropic etching recess in the high voltage device may be formed while the low voltage device is protected by a photo-resist layer, and then the isotropic etching recess in the low voltage device may be formed while the high voltage device is protected by another photo-resist layer. After the formation of the anisotropic etching recess in the high voltage device and the isotropic etching recess in the low voltage device, an epitaxial material may be filled into the anisotropic etching recess and the isotropic etching recess to individually form the first epitaxial structure and the second epitaxial structure. The low voltage device has a first beeline distance from the first epitaxial structure to the adjacent gate stack(s); and the high voltage structure has a second beeline distance from the second epitaxial structure to the adjacent gate stack(s). The second beeline distance of the high voltage device is greater than the first beeline distance of the low voltage device, so that the leakage current in the high voltage device may be decreased under high voltage operation.

In some embodiments of the present disclosure, an integrated circuit structure includes a substrate having a first area and a second area, a low voltage device disposed on the first area of the substrate, and a high voltage device disposed on the second area of the substrate. The low voltage device includes a first gate stack disposed on the first area of the substrate, a second gate stack disposed on the first area of the substrate, and a first epitaxial structure disposed in the first area of the substrate and between the first gate stack and the second gate stack. The low voltage device has a first beeline distance from the first epitaxial structure to the first gate stack or the second gate stack. The high voltage device includes a third gate stack disposed on the second area of the substrate, a fourth gate stack disposed on the second area of the substrate, and a second epitaxial structure disposed in the second area of the substrate and between the third gate stack and the fourth gate stack. The high voltage device has a second beeline distance from the second epitaxial structure to the third gate stack or the fourth gate stack. In the integrated circuit structure, the second beeline distance of the high voltage device is greater than the first beeline distance of the low voltage device.

In some embodiments of the present disclosure, a method for manufacturing an integrated circuit structure includes several operations. A plurality of gate stacks are individually formed on a first area and a second area of a substrate. A photo-resist layer is formed over the gate stacks on the first area of the substrate. An ion-doped layer is formed in the second area of the substrate. The photo-resist layer is removed. A first etching recess is formed in the first area and between two gate stacks on the first area of the substrate. A second etching recess is formed in the second area and between two gate stacks on the second area of the substrate. An epitaxial material is filled into the first etching recess and the second etching recess to individually form a first epitaxial structure and a second epitaxial structure. In the method for manufacturing an integrated circuit structure, the first epitaxial structure has a first beeline distance to a sidewall of the first gate stack or the second gate stack, and the second epitaxial structure has a second beeline distance to a sidewall of the third gate stack or the fourth gate stack. The second beeline distance is greater than the first beeline distance.

In some embodiments of the present disclosure, a method for manufacturing an integrated circuit structure includes several operations. A plurality of gate stacks are individually formed on a first area and a second area of a substrate. A first photo-resist layer is formed over the gate stacks on the first area of the substrate. A first etching recess is formed in the second area of the substrate and between two of the gate stacks on the second area of the substrate. The first photo-resist layer is removed. A second photo-resist layer is formed over the second area of the substrate. A second etching recess is formed in the first area of the substrate and between two of the gate stacks on the first area of the substrate. The second photo-resist layer is removed. An epitaxial material is filled into the first etching recess and the second etching recess to individually form a first epitaxial structure and a second epitaxial structure. In the method for manufacturing an integrated circuit structure, the first epitaxial structure has a first beeline distance to the first gate stack or the second gate stack, and the second epitaxial structure has a second beeline distance to the third gate stack or the fourth gate stack. The second beeline distance is greater than the first beeline distance.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing an integrated circuit structure, comprising:
   forming a plurality of gate stacks individually on a first area and a second area of a substrate;
   forming a photo-resist layer over the gate stacks on the first area of the substrate;
   forming an ion-doped layer in the second area of the substrate;
   removing the photo-resist layer;
   forming a first etching recess in the first area and between two gate stacks on the first area of the substrate;
   forming a second etching recess in the second area and between two gate stacks on the second area of the substrate; and
   filling an epitaxial material into the first etching recess and the second etching recess to individually form a first epitaxial structure and a second epitaxial structure,
   wherein the first epitaxial structure has a first beeline distance to a sidewall of a first gate stack or a second gate stack, and the second epitaxial structure has a second beeline distance to a sidewall of a third gate stack or a fourth gate stack, the second beeline distance is greater than the first beeline distance.

2. The method of claim 1, wherein forming the ion-doped layer is forming an N-type ion-doped layer or a P-type ion-doped layer.

3. The method of claim 1, wherein forming the first etching recess is forming an isotropic etching recess, and forming the second etching recess is forming an anisotropic etching recess.

4. The method of claim 1, wherein forming first etching recess and the second etching recess are by performing an etching process.

5. The method of claim 4, wherein the etching process includes an isotropic etching process.

6. The method of claim 1, wherein the first beeline distance and the second beeline distance form a difference being in a range of about 3 nm to about 10 nm.

7. A method for manufacturing an integrated circuit structure, comprising:
forming a plurality of gate stacks individually on a first area and a second area of a substrate;
forming a first photo-resist layer over the gate stacks on the first area of the substrate;
forming an ion-doped layer in the second area of the substrate;
forming a first etching recess in the second area of the substrate and between two of the gate stacks on the second area of the substrate;
removing the first photo-resist layer;
forming a second photo-resist layer over the second area of the substrate;
forming a second etching recess in the first area of the substrate and between two of the gate stacks on the first area of the substrate;
removing the second photo-resist layer; and
filling an epitaxial material into the first etching recess and the second etching recess to individually form a first epitaxial structure and a second epitaxial structure, wherein the first epitaxial structure has a first beeline distance to a first gate stack or a second gate stack, and the second epitaxial structure has a second beeline distance to a third gate stack or a fourth gate stack, the second beeline distance is greater than the first beeline distance.

8. The method of claim 7, wherein forming the first etching recess is forming an anisotropic etching recess, and forming the second etching recess is forming an isotropic etching recess.

9. The method of claim 7, wherein forming the first etching recess is by performing a first anisotropic etching process.

10. The method of claim 7, wherein forming the second etching recess is by performing a second anisotropic etching process and an isotropic etching process.

11. The method of claim 7, wherein the first beeline distance and the second beeline distance form a difference being in a range of about 3 nm to about 10 nm.

12. The method of claim 7, wherein forming the ion-doped layer is forming an N-type ion-doped layer or a P-type ion-doped layer.

13. The method of claim 7, wherein forming the ion-doped layer in the second area of the substrate comprises:
performing ion implantation on the second area of the substrate with carbon, germanium, boron, boron fluoride, phosphor, arsenic, antimony, or a combination thereof.

14. The method of claim 7, wherein after forming the ion-doped layer in the second area of the substrate, an etching rate of the second area is decreased.

15. A method of manufacturing an integrated circuit structure, comprising:
forming a plurality of gate stacks on a substrate and a shallow trench isolation in between the gate stacks, wherein the shallow trench isolation divides the substrate into a first area and a second area;
forming a photo-resist layer over the first or the second area;
performing an ion implantation on the first area or the second area to form an ion-doped layer;
removing the photo-resist layer over the first or the second area;
forming a first etching recess in the first area or the second area;
forming a second etching recess in the first area or the second area, wherein the second etching recess is in a different area from the first etching recess; and
filling an epitaxial material in the first etching recess and the second etching recess to form a first epitaxial structure and a second epitaxial structure respectively, wherein the first epitaxial structure has a first beeline distance to a sidewall of the gate stacks on the first area, and the second epitaxial structure has a second beeline distance to a sidewall of the gate stacks on the second area, the second beeline distance is greater than the first beeline distance.

16. The method of claim 15, wherein the first and second area have different etching rates.

17. The method of claim 15, wherein the ion-doped layer is an N-type ion-doped layer or a P-type ion-doped layer.

18. The method of claim 15, wherein the first beeline distance and the second beeline distance form a difference being in a range of about 3 nm to about 10 nm.

19. The method of claim 15, wherein performing the ion implantation on the first area or the second area to form the ion-doped layer comprises an ion implantation material including carbon, germanium, boron, boron fluoride, phosphor, arsenic, antimony, or a combination thereof.

20. The method of claim 15, wherein after performing the ion implantation on the first area or the second area to form the ion-doped layer, an etching rate of the first area or the second area is decreased.

* * * * *